United States Patent
Kardasz et al.

(10) Patent No.: US 10,461,242 B2
(45) Date of Patent: Oct. 29, 2019

(54) ANTIFERROMAGNETIC EXCHANGE COUPLING ENHANCEMENT IN PERPENDICULAR MAGNETIC TUNNEL JUNCTION STACKS FOR MAGNETIC RANDOM ACCESS MEMORY APPLICATIONS

(71) Applicant: Spin Memory, Inc.

(72) Inventors: Bartlomiej Adam Kardasz, Pleasanton, CA (US); Jorge Vasquez, San Jose, CA (US); Mustafa Pinarbasi, Morgan Hill, CA (US); Georg Wolf, San Francisco, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,449

(22) Filed: Dec. 30, 2017

(65) Prior Publication Data
US 2019/0207089 A1  Jul. 4, 2019

(51) Int. Cl.
| | | |
|---|---|---|
| *G11C 11/16* | (2006.01) | |
| *H01L 43/02* | (2006.01) | |
| *H01L 43/08* | (2006.01) | |
| *H01L 43/10* | (2006.01) | |
| *H01L 27/22* | (2006.01) | |
| *H01F 10/32* | (2006.01) | |

(52) U.S. Cl.
CPC .......... *H01L 43/02* (2013.01); *G11C 11/161* (2013.01); *G11C 11/1673* (2013.01); *H01F 10/3272* (2013.01); *H01F 10/3286* (2013.01); *H01L 27/222* (2013.01); *H01L 43/08* (2013.01); *H01L 43/10* (2013.01); *H01F 10/329* (2013.01)

(58) Field of Classification Search
CPC ....... H01L 43/02; H01L 43/10; H01L 27/222; H01L 43/08; G11C 11/161; G11C 11/1673
See application file for complete search history.

(56) References Cited

U.S. PATENT DOCUMENTS

| | | | | |
|---|---|---|---|---|
| 2007/0096229 | A1* | 5/2007 | Yoshikawa | G11C 11/16 257/421 |
| 2012/0043631 | A1* | 2/2012 | Ohmori | H01L 43/08 257/421 |

* cited by examiner

*Primary Examiner* — Mohammed A Bashar
(74) *Attorney, Agent, or Firm* — Zilka-Kotab, P.C.

(57) ABSTRACT

A magnetic memory element for Magnetic Random Access Memory. The magnetic memory element has improved reference layer magnetic pinning. The magnetic memory element has a magnetic free layer, a magnetic reference layer and a non-magnetic barrier layer located between the magnetic free layer and the magnetic reference layer. The magnetic reference layer has a magnetic moment that is pinned in a perpendicular orientation through exchange coupling with a synthetic antiferromagnetic structure that includes first and second magnetic structures and an antiferromagnetic exchange coupling structure located between the first and second magnetic structures. The antiferromagnetic exchange coupling structure includes a layer of Ru located between first and second layers of Pt. The Pt layers in the antiferromagnetic exchange coupling structure advantageously increases the magnetic proximity effect at both Ru interfaces, which extends the exchange coupling range of the antiferromagnetic exchange coupling layer.

20 Claims, 3 Drawing Sheets

ANTIFERROMAGNETIC EXCHANGE COUPLING ENHANCEMENT IN PERPENDICULAR MAGNETIC TUNNEL JUNCTION STACKS FOR MAGNETIC RANDOM ACCESS MEMORY APPLICATIONS

FIELD OF THE INVENTION

The present invention relates to magnetic random access memory (MRAM), and more particularly to a magnetic random access memory element having improved reference layer pinning robustness.

BACKGROUND

Magnetic Random Access Memory (MRAM) is a non-volatile data memory technology that stores data magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

The present invention provides a magnetic memory element for magnetic random access memory storage. The magnetic memory element includes a magnetic free layer, a magnetic reference layer and a non-magnetic barrier layer located between the magnetic free layer and the magnetic reference layer. The memory element also includes a synthetic antiferromagnetic structure that is exchange coupled with the magnetic reference layer. The synthetic antiferromagnetic structure includes first and second magnetic structures and an antiparallel exchange coupling structure located between the first and second magnetic structures. The antiparallel exchange coupling structure includes a layer of Ru located between first and second layers of Pt.

The first and second magnetic structures of the synthetic antiferromagnetic structure can each include a layer of Pt and a layer of Co. Preferably, the magnetic structures are arranged so that the layer of Co is located toward the antiparallel exchange coupling structure.

The presence of the Pt layers in the antiparallel exchange coupling structure advantageously extends the magnetic proximity effect of the antiferromagnetic exchange coupling structure to further improve pinning of the magnetization of the reference layer to enhance robustness of the magnetic data element.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

The following description includes the best embodiments presently contemplated for carrying out the invention. This description is made for the purpose of illustrating the general principles of this invention and is not meant to limit the inventive concepts claimed herein in any way.

Figure 1:
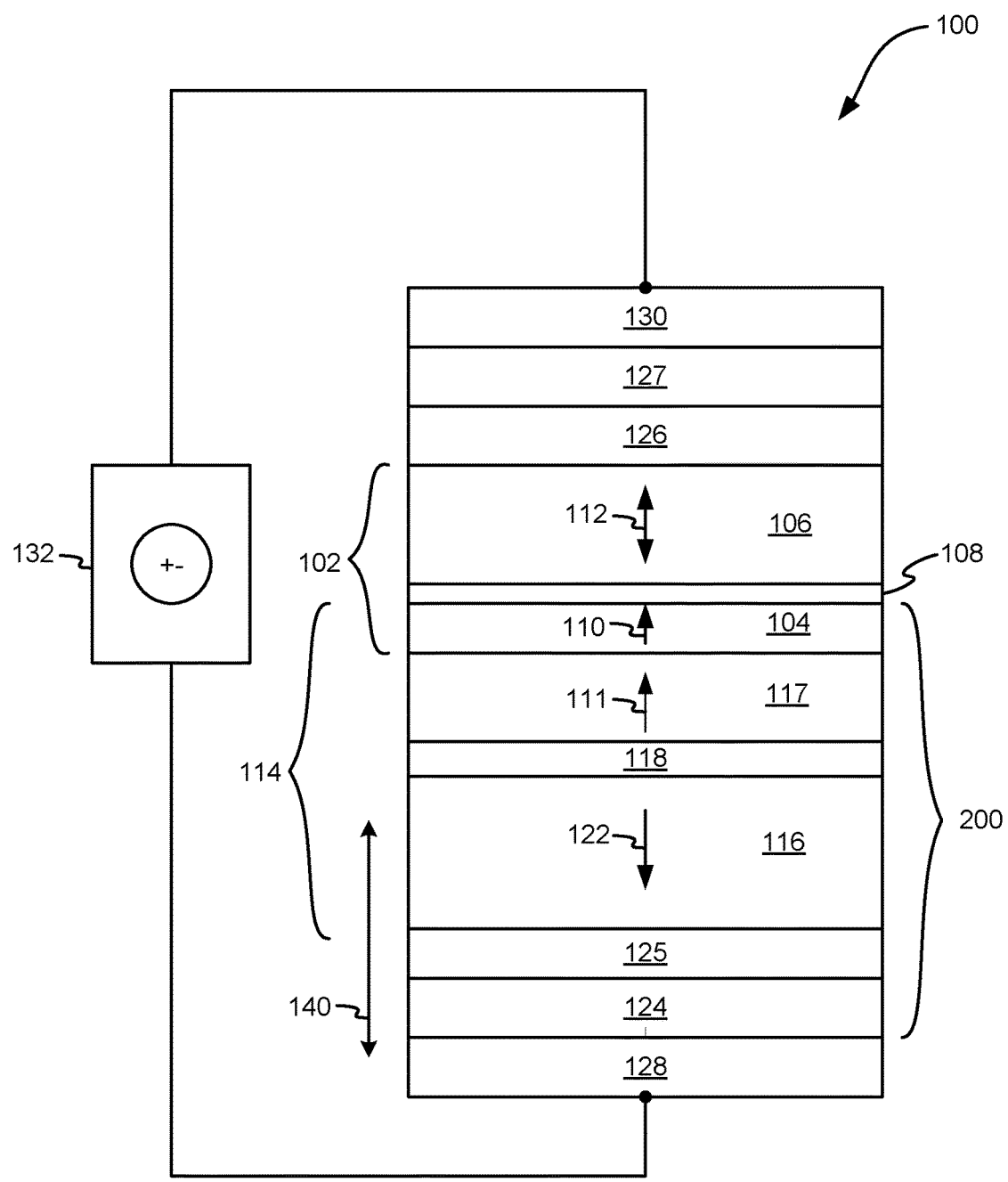
FIG. 1 is a schematic, cross-sectional view of a portion of a magnetic memory element, according to an embodiment.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in an element height direction 140. The barrier layer 108 may include an oxide, such as MgO, or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows 112. While the magnetization 112 of the free layer 106 remains in either of two directions perpendicular to the plane of the free layer 106 in a quiescent state, it may be selectably switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a first magnetic layer structure (SAF1) 116, a second magnetic layer structure (SAF2) 117, and a non-magnetic, antiparallel coupling layer 118 positioned between the SAF1 layer 116 and the SAF2 layer 117 in the element height direction 140. The antiparallel coupling layer 118 may comprise any suitable material known in the art, such as Ru, and may be constructed to have a thickness that causes antiferromagnetic coupling of the SAF1 layer 116 and the SAF2 layer 117. The antiparallel coupling between the SAF1 layer 116 and the SAF2 layer 117 pins the magnetization 111 of the SAF2 layer 117 in a direction that is opposite to that of the magnetization 122 of the SAF1 layer 116. Exchange coupling between the SAF2 layer 117 and the reference layer 104 pins the magnetization 110 of the reference layer 104 in the same direction as the magnetization 111 of the SAF2 layer 117 as shown in FIG. 1.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in a downward direction in FIG. 1, applying a current in a downward direction through the memory element 100 will cause electrons to flow in an opposite direction upward through the element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions.

On the other hand, if the magnetization 112 of the free layer 106 is initially in an upward direction in FIG. 1, applying an electrical current through the memory element 100 in an upward direction in FIG. 1 causes electrons to flow in an opposite direction, downward through the memory element 100. However, because the magnetization 112 of the free layer 106 is in the same direction as the magnetization 110 of the reference layer 104, the electrons with opposite spin will not be able to pass through the barrier layer 108 into the reference layer 104. As a result, the electrons with the opposite spin will accumulate at the junction between the free layer 106 and the barrier layer 108. This accumulation of spin polarized electrons causes a spin torque that causes the magnetization 112 of the free layer 106 to flip from an upward direction to a downward direction.

Data retention is an important performance parameter for a non-volatile memory such as Magnetic Random Access Memory. "Retention" refers to the ability of a data memory device to maintain recorded data over time at in a variety of environments (such as temperature) without loss of data. The "endurance" of a magnetic memory system refers to the ability to be able to operate over many cycles, while being able to accurately and robustly record magnetic data. One factor that affects the retention and endurance of a magnetic memory element is the ability of the magnetic reference layer 117 to maintain its magnetization 111 over a long period of time and over a wide range of operating conditions such as variations in temperature.

Magnetic stability of the reference layer 104 can be improved by incorporating the reference layer 104 into a synthetic anti-ferromagnetic structure (SAF). Such a structure as shown in FIG. 1 can include a first magnetic layer structure SAF1 116, and a second magnetic layer structure 117, which are both anti-parallel exchange coupled across a non-magnetic exchange coupling layer 118. The Exchange coupling layer 118, which can be a material such as Ru has a thickness that is chosen to anti-parallel couple the magnetic layer structures 116, 117 so that the SAF1 layer 116 has a magnetization 122 that is oriented in a first direction 122 that is perpendicular to the plane of the layer 116. The antiferromagnetic coupling between the SAF1 layer 116 and SAF2 layer 117 causes the SAF2 layer 117 to have a magnetization 111 that is opposite (e.g. anti-parallel with) the magnetization 122 of the SAF1 layer 116, as shown in FIG. 1. The reference layer 104 is magnetically exchange coupled with the SAF2 layer 117 so that it has a magnetization 110 that is pinned in the same direction as the magnetization 111 of the SAF2 layer 117.

Another advantage of the SAF structure described above is that the magnetic moment of the layer 116 can be balanced with the magnetic layers 117, 104 to result in a net zero or nearly net zero magnetic moment. This advantageously result in little or no dipole fringing field which would otherwise negatively affect the magnetization 112 of the magnetic free layer 106, and which could result in instability of the magnetic free layer 106 and loss of data retention.

Even with the advantage of the SAF structure described above, there remains a need to ensure strong magnetic pinning of the magnetization 110 of the reference layer 104 in a direction that is perpendicular to the plane of the layer 104. Antiferromagnetic exchange coupling can be used to improve pinning of the magnetization 110 of the reference layer 104. Thin, nonmagnetic materials such as Ru or Cr having a thickness of about 1 nm can be used as exchange coupling layers. Possible structures include multi-layer structures of Co and Pt forming synthetic antiferromagnetic (SAF) structures.

According to an embodiment, antiferromagnetic coupling in synthetic antiferromagnetic (SAF) structures can be increased by using extended magnetic proximity effect of noble metals such as Pt, Pd adjacent to an exchange coupling material such as Ru or Cr.

Magnetic proximity effect is an interface phenomenon in magnetic heterostructures. In general it refers to the influence that a ferromagnetic state layer has on an adjacent layer. In the case of a ferromagnetic/non-magnetic interface, magnetization can be introduced within non-magnetic materials. When ferromagnetic materials such as Co are separated by a non-magnetic layer such as Ru, proximity effects occur at both interfaces, which can give rise to interlayer exchange coupling. However, the range of the proximity region is small, typically only 1 nm, since antiferromagnetic exchange coupling decays very fast with increasing thickness of Ru above 1 nm.

The present invention extends further the magnetic proximity effect by depositing a thin Pt layer adjacent to a Ru exchange coupling layer. As a result, interlayer exchange coupling can be enhanced using a Pt/Ru/Pt structure, which leads to an increase in $H_{ex}$ of the synthetic antiferromagnetic structure and improved reference layer pinning in the perpendicular magnetic tunnel junction layer stack.

Figure 2:
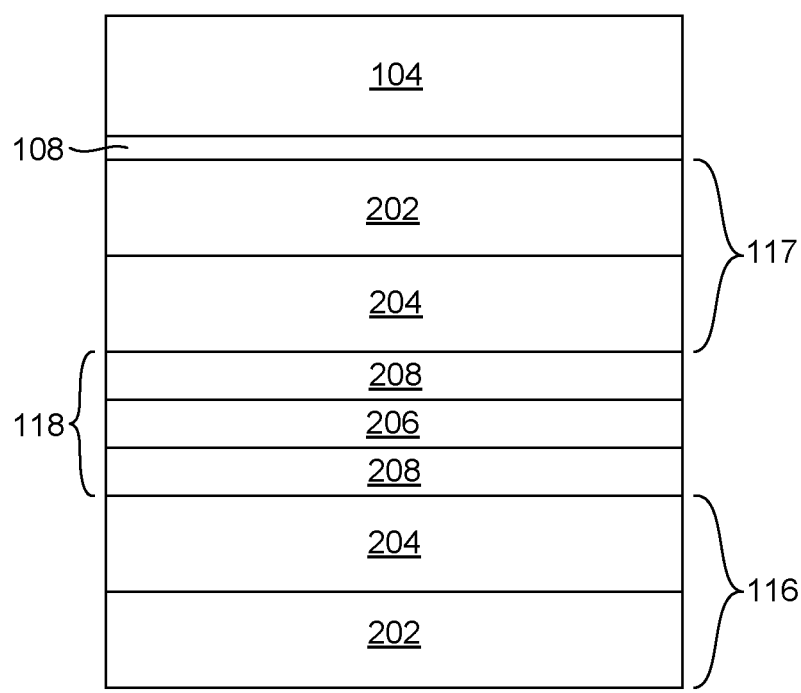
FIG. 2 an enlarged view of a portion of the magnetic memory element shown in bracket 200 in FIG. 1.

For example, FIG. 2 illustrates a structure which can take advantage of this effect to greatly improved reference layer magnetic pinning robustness. FIG. 2 is an enlarged view of a portion of a magnetic memory element structure, such as shown in bracket 200 in FIG. 1. FIG. 2 shows a structure that includes first and second magnetic layers SAF1 and SAF2 116, 117 that are separated by a novel antiparallel exchange coupling structure 118. The SAF2 layer 117 is exchange coupled with the magnetic reference layer 104. The exchange coupling between the SAF2 structure 117 and the reference layer 104 can be achieved through a magnetic exchange coupling layer 108, located between the SAF2 structure 117 and the reference layer 104. The magnetic exchange coupling layer 108 can be a material such as Co, along with a layer of a metal such as W, Mo or Ta.

The SAF1 and SAF2 structures 116, 117 can be formed as a multi-layer structure that can include a layer of Pt 202 and a layer of Co 204 repeated many times (ie. Pt/Co/Pt/Co/Pt/Co). In each case, the magnetic structure 116, 117 is configured such that the layer of Co 204 is preferably located closest to the antiparallel exchange coupling structure 118, and can be arranged such that the layer of Co 204 contacts a Pt layer 208 of the antiferromagnetic exchange coupling layer. In the SAF1 structure 116 the Pt layer 202 can have a thickness of 0.1 to 0.25 nm, and the Co layer 204 can have a thickness of 0.15 to 0.3 nm. In the SAF2 structure 117, the Pt layer 202 can have a thickness of 0.15 to 0.3 nm and the Co layer 204 can have a thickness of 0.1 to 0.25 nm.

The antiparallel exchange coupling structure 118 includes a layer of Ru 206, which is located between first and second layers of Pt 208. The layer of Ru 206 can have a thickness of 0.6-1.0 nm or about 0.8 nm. Each of the Pt layers 208 can have a thickness of 0.15-0.3 nm. Enhanced antiferromagnetic coupling in the Ru layer 206 is provided by additional magnetic proximity effect induced in the Pt layers 208 at either side of the Ru layer 216. This increased proximity effect is at both Ru/Pt interfaces and extends the antiferromagnetic coupling range by using Co/Pt ferromagnetic heterostructures. The resulting Co/Pt synthetic antiferromagnetic structure can form either multilayer or superlattice structures depending on the deposition process used to deposit the layers 206, 208 and depending on the thickness of the Co layers 204 and Pt layers 202 of the antiferromagnetic structures 116, 117, and are magnetized in a direction perpendicular to the plane of the layers.

The above described structure results in an increase in antiferromagnetic exchange coupling in the synthetic antiferromagnetic structure 116, 117, 118, which significantly enhances magnetic stability of the reference layer 104. The above described structure also results in an increase in perpendicular magnetic anisotropy for the synthetic antiferromagnetic structure 116, 117, 118, which results in improved stability of the reference layer 104. Enhanced antiferromagnetic exchange coupling can be achieved without decreasing magnetic coercivity, thereby further improving reference layer stability.

Figure 3:
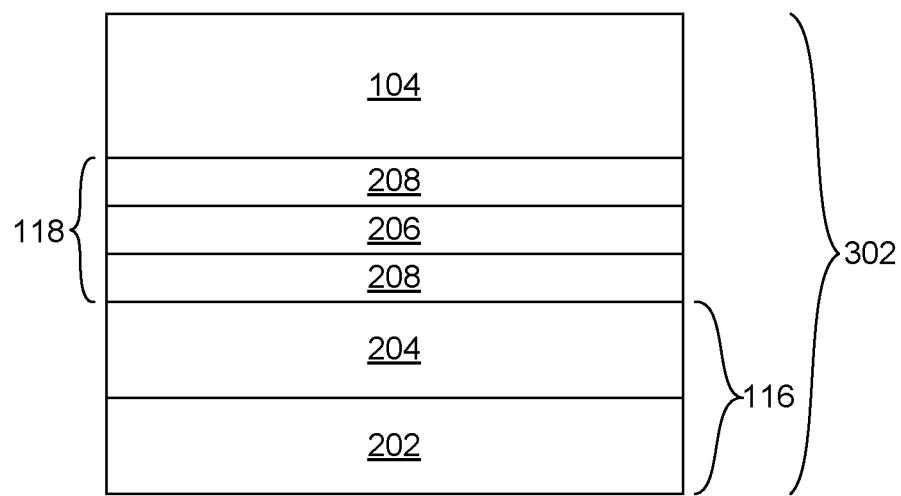
FIG. 3 is an enlarged view of a portion of a magnetic memory element according to an alternate embodiment of the invention.

FIG. 3 illustrates an alternate embodiment for utilizing a Pt/Ru/Pt exchange coupling structure for improved reference layer retention. In the embodiment of FIG. 3, the SAF2 layer 117 (FIG. 2) is not included. Instead, the reference layer 104 itself acts as a second magnetic layer of an SAF structure 302. The embodiment of FIG. 3, includes the SAF1 structure 116 that can include a layer of Pt 202 and a layer of Co 204 in a multilayer form of Pt/Co/Pt/Co/Pt/Co). Again, the layer of Pt 202 can have a thickness of 0.1 to 0.225 nm and the layer of Co 204 can have a thickness of 0.15 to 0.3 nm. The antiparallel exchange coupling structure 118 includes a layer of Ru 206 located between first and second layers of Pt 208. The layer of Ru 206 can have a thickness of about 0.8 nm, and the layers of Pt 208 can each have a thickness of 0.15 to 0.3 nm.

The reference layer 104 can be constructed of CoFeB, and is antiferromagnetically coupled with the SAF1 layer 116 across the antiparallel exchange coupling structure 118. As with the previously described embodiment, the enhanced antiferromagnetic coupling of the Ru layer 206, along with additional proximity effect of the Pt layers 208 at both Ru interfaces extends the antiferromagnetic coupling range using ferromagnetic heterostructures, resulting in improved reference layer 104 stability.

It should also be pointed out that, although the embodiments have been described with reference to a structure having a magnetic free layer formed above the reference layer structure, the order could also be reversed. The described structure for improving reference layer retention could also be employed in a structure wherein the magnetic free layer structure is at the bottom and the reference layer and SAF structure are located above the magnetic free layer.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic memory element, comprising:
   a magnetic free layer;
   a magnetic reference layer;
   a non-magnetic barrier layer located between the magnetic reference layer and the magnetic free layer; and
   a synthetic antiferromagnetic structure exchange coupled with the magnetic reference layer, the synthetic antiferromagnetic structure further comprising:
   a first magnetic structure;
   a second magnetic structure; and
   an antiferromagnetic exchange coupling structure located between the first and second magnetic structures, the antiferromagnetic exchange coupling structure including a layer of Ru located between first and second layers of Pt.

2. The magnetic memory element as in claim 1, wherein each of the first and second magnetic structures includes a layer of Pt and a layer of Co.

3. The magnetic memory element as in claim 1, wherein each of the first and second magnetic structures includes a layer of Pt and a layer of Co arranged such that the layer of Co is closest to the antiferromagnetic exchange coupling structure.

4. The magnetic memory element as in claim 1, wherein each of the first and second magnetic structures includes a layer of Pt and a layer of Co arranged such that the layer of Co contacts a Pt layer of the antiferromagnetic exchange coupling structure.

5. The magnetic memory element as in claim 1, wherein each of the Pt layers of the antiferromagnetic exchange coupling layer has a thickness of 0.15 to 0.3 nm.

6. The magnetic memory element as in claim 1, wherein the Ru layer of the antiferromagnetic exchange coupling layer has a thickness of 0.15 to 0.3 nm.

7. The magnetic memory element as in claim 2, wherein the layer of Pt of each magnetic structure has a thickness of 0.1 to 0.25 nm, and the layer of Co of each magnetic structure has a thickness of 0.15 to 0.3 nm.

8. The magnetic memory element as in claim 1, wherein each of the magnetic reference layer and magnetic free layer comprises CoFeB.

9. A magnetic memory element, comprising:
   a synthetic antiferromagnetic structure that includes a magnetic structure, a magnetic reference layer and an antiparallel exchange coupling structure located between and exchange coupled with the magnetic reference layer and the magnetic structure;
   a magnetic free layer; and
   a non-magnetic barrier layer located between the magnetic free layer and the magnetic reference layer structure; wherein
   the antiferromagnetic exchange coupling structure comprises a layer of Ru located between first and second layers of Pt.

10. The magnetic memory element as in claim 9, wherein the magnetic structure includes a layer of Pt and a layer of Co.

11. The magnetic memory element as in claim 9, wherein the magnetic structure includes a layer of Pt and a layer of Co arranged such that the layer of Co is closest to the antiferromagnetic exchange coupling structure.

12. The magnetic memory element as in claim 9, wherein the magnetic reference layer comprises CoFeB.

13. The magnetic memory element as in claim 9, wherein free layer comprises CoFeB.

14. The magnetic memory element as in claim 9, wherein the non-magnetic barrier layer comprises MgO.

15. The magnetic memory element as in claim 9, wherein each Pt layer of the antiferromagnetic exchange coupling layer has a thickness of 0.15 to 0.3 nm.

16. The magnetic memory element as in claim 9, wherein the layer of Ru of the antiferromagnetic exchange coupling layer has a thickness of about 0.8 nm.

17. The magnetic memory element as in claim 9, wherein the magnetic structure includes a layer of Pt having a thickness of 0.1 to 0.25 nm and a layer of Co having a thickness of 0.15 to 0.3 nm.

18. A magnetic random access memory system, comprising:
   a magnetic memory element; and
   circuitry electrically connected with the magnetic memory element, the circuitry being functional to supply a switching current to the magnetic memory element and to read an electrical resistance across the magnetic memory element;
   wherein the magnetic memory element further comprises:
   a magnetic free layer;
   a magnetic reference layer;
   a non-magnetic barrier layer located between the magnetic reference layer and the magnetic free layer; and
   a synthetic antiferromagnetic structure exchange coupled with the magnetic reference layer, the synthetic antiferromagnetic structure further comprising:
   a first magnetic structure;
   a second magnetic structure; and
   an antiferromagnetic exchange coupling structure located between the first and second magnetic structures, the antiferromagnetic exchange coupling structure including a layer of Ru located between first and second layers of Pt.

19. The magnetic random access memory system, as in claim 18, wherein the first and second magnetic structures each comprise a layer of Pt and a layer of Co.

20. The magnetic random access memory system as in claim 18, wherein each of the first and second magnetic structures comprises a layer of Pt and a layer of Co, arranged such that the layer of Co is located closest to the antiparallel exchange coupling structure.

* * * * *